(12) United States Patent
Kumar et al.

(10) Patent No.: US 8,343,781 B2
(45) Date of Patent: Jan. 1, 2013

(54) ELECTRICAL MASK INSPECTION

(75) Inventors: Arvind Kumar, Hopewell Junction, NY (US); Anthony I-Chih Chou, Hopewell Junction, NY (US); Shreesh Narasimha, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 115 days.

(21) Appl. No.: 12/886,612

(22) Filed: Sep. 21, 2010

(65) Prior Publication Data

US 2012/0068174 A1 Mar. 22, 2012

(51) Int. Cl.
*G01R 31/26* (2006.01)
*H01L 21/66* (2006.01)

(52) U.S. Cl. ........ 438/18; 438/17; 257/48; 257/E21.531

(58) Field of Classification Search .................... 438/17, 438/18, 622; 257/E21.531, E21.575, E23.142, 257/48

See application file for complete search history.

(56) References Cited

U.S. PATENT DOCUMENTS

| | | | |
|---|---|---|---|
| 5,119,313 A * | 6/1992 | Shaw et al. ...................... 326/38 |
| 5,461,577 A * | 10/1995 | Shaw et al. ................... 716/116 |
| 5,707,881 A * | 1/1998 | Lum ................................ 438/15 |
| 5,747,095 A * | 5/1998 | McAllister et al. ............... 427/8 |
| 6,080,596 A | 6/2000 | Vindasius et al. |
| 6,255,726 B1 | 7/2001 | Vindasius et al. |
| 6,427,324 B1 * | 8/2002 | Franklin et al. ................. 29/852 |
| 6,445,065 B1 * | 9/2002 | Gheewala et al. ............ 257/691 |
| 6,617,621 B1 * | 9/2003 | Gheewala et al. ............ 257/207 |
| 6,812,488 B2 * | 11/2004 | Zhang .............................. 257/48 |
| 6,836,020 B2 | 12/2004 | Cheng et al. |
| 7,200,930 B2 | 4/2007 | Khandros et al. |
| 7,517,798 B2 | 4/2009 | Tuttle |
| 7,598,523 B2 * | 10/2009 | Luo et al. ......................... 257/48 |
| 7,622,377 B2 | 11/2009 | Lee et al. |
| 7,786,562 B2 * | 8/2010 | Ozguz et al. ................... 257/686 |
| 2005/0015699 A1 * | 1/2005 | Or-Bach ........................ 714/759 |
| 2005/0024086 A1 * | 2/2005 | Or-Bach ........................ 326/41 |
| 2005/0277288 A1 * | 12/2005 | Ozguz et al. ................... 438/637 |
| 2009/0114913 A1 * | 5/2009 | Bernstein et al. ............... 257/48 |

(Continued)

FOREIGN PATENT DOCUMENTS

EP 1891670 B1 2/2010

(Continued)

OTHER PUBLICATIONS

Mak, T.M.; Test Challenges for 3D Circuits; 12th IEEE International On-Line Testing Symposium; Jul. 10-12, 2006.

(Continued)

*Primary Examiner* — Jarrett Stark

(74) *Attorney, Agent, or Firm* — Ian D MacKinnon; Howard M Cohn

(57) ABSTRACT

An apparatus and method for electrical mask inspection is disclosed. A scan chain is formed amongst two metal layers and a via layer. One of the three layers is a functional layer under test, and the other two layers are test layers. A resistance measurement of the scan chain is used to determine if a potential defect exists within one of the vias or metal segments comprising the scan chain.

12 Claims, 4 Drawing Sheets

U.S. PATENT DOCUMENTS

| | | | |
|---|---|---|---|
| 2011/0210452 A1* | 9/2011 | Roozeboom et al. | 257/774 |
| 2011/0231722 A1* | 9/2011 | Mukherjee et al. | 714/729 |
| 2011/0304994 A1* | 12/2011 | Mair | 361/748 |
| 2012/0028436 A1* | 2/2012 | Or-Bach et al. | 438/401 |
| 2012/0068174 A1* | 3/2012 | Kumar et al. | 257/48 |
| 2012/0081137 A1* | 4/2012 | Pagani et al. | 324/750.01 |

FOREIGN PATENT DOCUMENTS

| | | | |
|---|---|---|---|
| WO | WO2008137585 A3 | 11/2008 | |

OTHER PUBLICATIONS

Henry, D., et al.; Silicon Through Vias for System-on-Wafer (SoW): Technology and SiO2 Insulation Layer Characterization; IEEE, 2006 First Electronic System Integration Technology Conf.; pp. 274-281; Dresden, Germany, 2006.

* cited by examiner

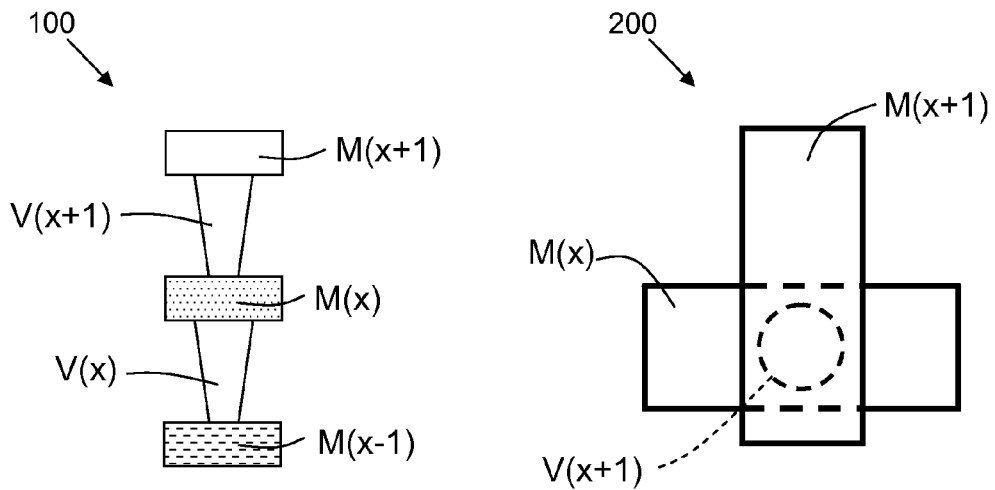
FIG.1 (Prior Art)
FIG.2 (Prior Art)
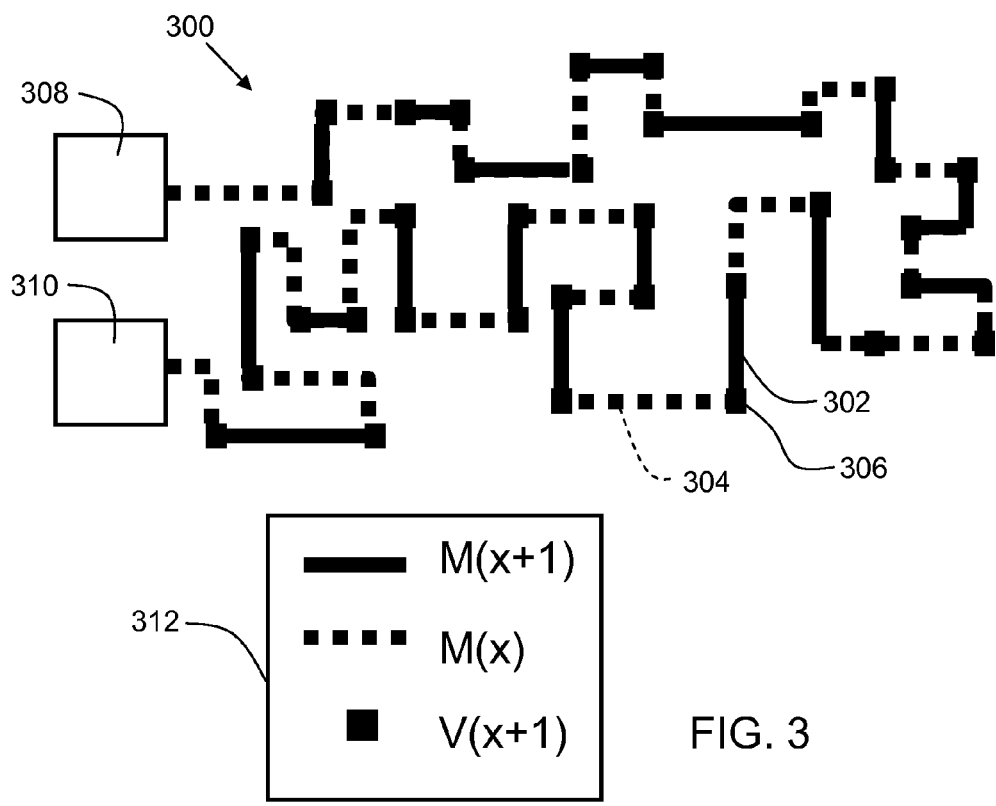
FIG. 3

ELECTRICAL MASK INSPECTION

FIELD OF THE INVENTION

The present invention relates generally to semiconductor fabrication, and more specifically to techniques for inspecting and verifying masks used in the fabrication of semiconductors.

BACKGROUND OF THE INVENTION

The capacity of integrated circuits has increased primarily as the result of reductions in the size of features on a semiconductor chip. The lateral dimensions of features are generally defined by photolithographic techniques in which a detailed pattern is transferred to a reactive material by shining light through a photomask or reticle. In this disclosure, the term "photomask" is interchangeable with the term "reticle." During the photolithography process, energy is applied to photoresist deposited on a wafer, where the energy application is controlled through the use of a patterned photomask. The exposure to the wafer is made by a step and repeat procedure. In this procedure, the wafer is moved and the steppers are used to move and repeat the pattern of the photomask over the wafer.

Printable defects on photomasks and reticles have historically been a source of defects that have reduced die yields. Printable defects in the photomasks are repeated many times over the surface of a semiconductor wafer since the photomask is stepped and repeated over the wafer. When defects are present on the photomask, this can result in substantial yield losses. Accordingly, it is important to detect as many defects as possible in the photomasks. Furthermore, defects can occur with repeated use of the photomask. Therefore, it is desirable to have an improved apparatus and method for inspection of photomasks.

SUMMARY OF THE INVENTION

One embodiment of the present invention provides a test circuit comprises: a first endpoint (pad); a second endpoint (pad); a first metal layer, comprising a plurality of segments; a second metal layer, comprising a plurality of segments; a via layer, comprising a plurality of vias wherein each via is configured and disposed to connect a segment of the first metal layer to a segment of the second metal layer; wherein the first metal layer comprises a segment connected to said first endpoint and also comprises a segment connected to said second endpoint; wherein one of the layers selected from the group consisting of the first metal layer, the second metal layer, and the via layer is a functional layer, and the remaining layers of said group are test layers.

Another embodiment of the present invention provides a method for testing an integrated circuit. The method comprises the steps of: forming a first endpoint; forming a second endpoint; forming a first metal layer, comprising a plurality of segments; forming a second metal layer, comprising a plurality of segments; forming a via layer, comprising a plurality of vias wherein each via is configured and disposed to connect a segment of the first metal layer to a segment of the second metal layer; wherein the step of forming the first metal layer comprises forming a segment connected to said first endpoint and also comprises forming a segment connected to said second endpoint; and wherein one of the layers formed is a functional layer, and wherein two of the layers formed are test layers.

Another embodiment of the present invention provides a method for testing an integrated circuit. The method comprises the steps of: forming a plurality of scan chains, each scan chain formed by the steps of: forming a first endpoint; forming a second endpoint; forming a first metal layer, comprising a plurality of segments; forming a second metal layer, comprising a plurality of segments; forming a via layer, comprising a plurality of vias wherein each via is configured and disposed to connect a segment of the first metal layer to a segment of the second metal layer; wherein the step of forming the first metal layer comprises forming a segment connected to said first endpoint and also comprises forming a segment connected to said second endpoint; and wherein one of the layers formed is a functional layer, and wherein two of the layers formed are test layers; performing a resistance measurement between the first endpoint and second endpoint of each of the plurality of scan chains; and indicating a failure if the resistance measurement exceeds a predetermined threshold.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG).

FIG. 1 is a side view of a portion of a multiple layer integrated circuit.

FIG. 2 is a top-down view of a portion of a multiple layer integrated circuit.

FIG. 3 shows a scan chain for testing a via level.

FIGS. 3B and 3C show integrated circuits which comprise multiple test circuits.

FIG. 4 shows a scan chain for testing a metal level.

FIG. 5 shows a flowchart for calculating parameters for conducting a via level test.

FIG. 6 shows a flowchart for calculating parameters for conducting a metal level test.

DETAILED DESCRIPTION

Figure 3B:
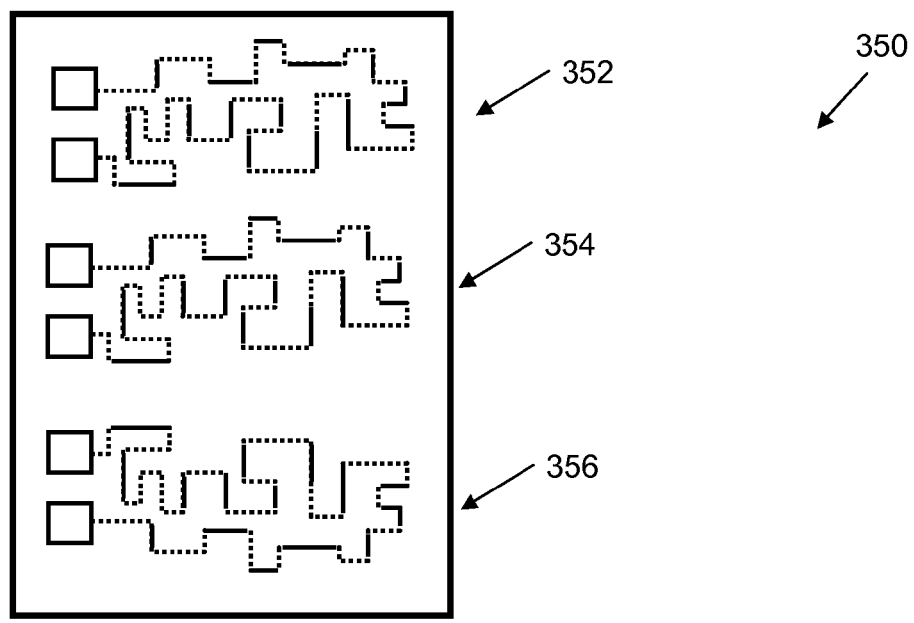

FIG. 1 is a side view of a portion of a multiple layer integrated circuit 100. At certain points within the integrated circuit, two metal layers are electrically connected by conductive vias. As shown in FIG. 1, metal layer M(x) is connected to metal layer M(x−1) with a via at via layer V(x). Furthermore, metal layer M(x) is connected to metal layer M(x+1) with via level V(x+1).

FIG. 2 is a top view of a portion of a multiple layer integrated circuit 200. Metal layer M(x+1) is electrically connected to metal layer M(x) through via layer V(x+1). In general, an integrated circuit may be comprised of millions of devices, such as transistors and capacitors interconnected by multiple metal layers and via layers. Testing connectivity at each "level" (e.g. M1, M2, V1, etc . . . ) of an integrated circuit can be challenging. Embodiments of the present invention serve to provide an effective way to periodically check the masks corresponding to various levels. A functional level is a portion of a circuit used for a working integrated circuit, such as a DRAM, processor, or other device. A working device may have multiple functional metal levels, and in general, a device with N functional metal levels has (N−1) functional via levels.

FIG. 3 shows a test circuit (scan chain) 300 in accordance with an embodiment of the present invention. Test circuit 300 is used to test the functional V(x+1) level photomask. To perform the test of the functional V(x+1) level photomask, functional M(x+1) level and M(x) levels are replaced with a test M(x+1) level and a test M(x) level respectively. Test pads 308 and 310 are the endpoints of test circuit 300. Test circuit 300 is also referred to as a scan chain. The scan chain is used to test a portion of an integrated circuit. The scan chain comprises two endpoints, which are pads (308 and 310), and a plurality of metal segments (shown generally as 302 and 304) which terminate at vias (shown generally as 306). As per legend 312, segment 302 (represented as a solid line) is a part of metal layer M(x+1) and segment 304 (represented as a dotted line) is a part of metal layer M(x). Each square represents a via in level V(x+1). The M(x) and M(x+1) segments are part of test metal layers. The layer V(x+1) is a functional via layer (i.e. V(x+1) is a layer used in a functional integrated circuit). In one embodiment, multiple scan chains are used to test an entire integrated circuit. In one embodiment, 24 pads may be used. Each pad is fairly large compared to the feature size. In one embodiment, the pads are of a square shape, ranging in size from about 60 microns to about 100 microns. During testing, a standard wafer probing diagnostic tool, widely used in the industry, performs a resistance measurement between pad 308 and pad 310. This tests the functional via level V(x+1) by using test levels for M(x) and M(x+1). The test levels of M(x) and M(x+1) are arranged such that functional vias form a part of the scan chain. If there is a connectivity problem with one of the vias, then the resistance measured across pads 308 and 310 is larger than if the connectivity is good. When the resistance measured across pads 308 and 310 exceeds a predetermined value (e.g. 150 Ohms) a failure is indicated. In this way, it is possible to quickly determine that a connectivity problem exists in at least one of the vias in the scan chain.

The predetermined threshold resistance depends on the properties of the scan chain. For any given technology and process, the specified resistance range for either a via (ohms per via) or a metal line (ohms/square) can be used to determine the resistance value above which, a reading will be considered as indicative of a circuit failure.

The maximum resistance specified for any given scan chain is computed as:

$$(V \times Rv) + (Ms \times Rs)$$

Where V is the number of vias, Rv is the resistance of a via, Ms is the number of metal squares, and Rm is the resistance of a metal square. Each metal line is considered as a plurality of metal squares for the purposes of the resistance calculation. A longer metal line is composed of more squares than a shorter metal line. Hence the length of the metal lines are considered when computing the threshold resistance.

For example, supposing the resistance of a via is 5 ohms per via, and the resistance of a metal level is 1 ohm per square, and that a particular scan chain has 10 vias and 100 squares of metal, the resistance threshold is computed, using the above formula, as:

$$10 \times 5 + 100 \times 1 = 50 + 100 = 150 \text{ Ohms}$$

Measured resistances exceeding 150 ohms for this scan indicates that one of the elements within the scan chain is outside the specified range, and is considered as an issue that warrants further investigation.

In one embodiment of the present invention, a functional device is divided into logical subgroups. These subgroups may be based on functional blocks (e.g. ALU, shift registers, and memory circuits) or on various locations within the integrated circuit. Each scan chain is then associated with a particular functional area of the chip. This allows each scan chain to test a particular functional area of the chip (e.g. ALU, shift registers, and memory circuits).

FIG. 3B shows an integrated circuit 350 comprising multiple test circuits 352, 354, and 356. In this way, the entire number of vias within a level are divided among the three test circuits (scan chains). If there is a failure (indicated by a high resistance reading across the two pads of the scan chain), then the failure can then be isolated to a subgroup of the vias belonging to the particular scan chain, which aids in identifying the faulty vias. Once the subgroup containing the faulty via is identified, the defect may be further localized to a specific via or vias by voltage-contrast techniques. In the embodiment of FIG. 3B, the functional elements under test (e.g. vias of a functional level) are assigned to a particular test circuit based on physical positioning of that element within the chip. Elements in the top portion of the chip are tested with test circuit 352. Elements in the middle portion of the chip are tested with test circuit 354. Elements in the bottom portion of the chip are tested with test circuit 356.

Figure 3C:
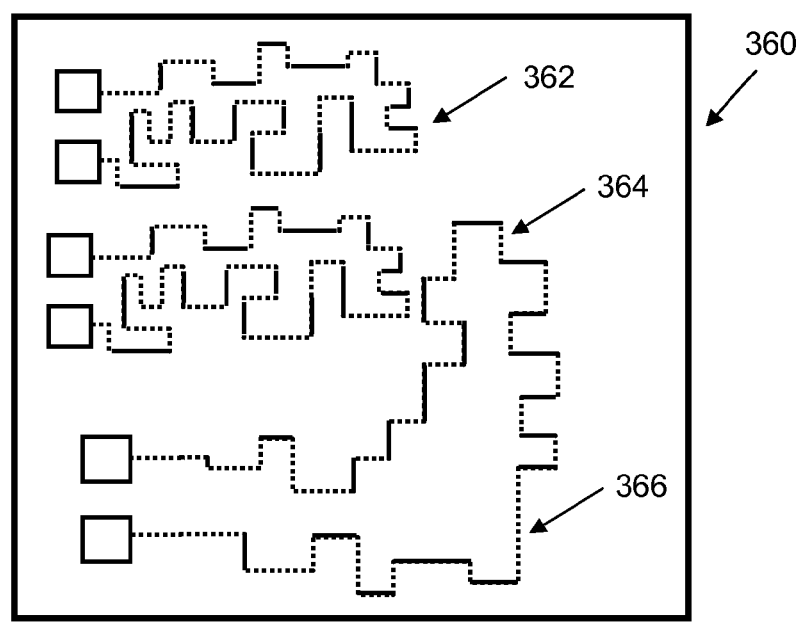

FIG. 3C shows an integrated circuit 360 comprising multiple test circuits 362, 364, and 366. In this case, each test circuit is associated with a particular functional area of the chip, meaning that each test circuit comprises functional elements (e.g. vias or metal segments) that correspond to a particular functional area. This allows each scan chain to test a particular functional area of the chip. For example, in one embodiment, test circuit 362 may be associated with an ALU, test circuit 364 may be associated with shift registers, and test circuit 366 may be associated with memory circuits.

Figure 4:
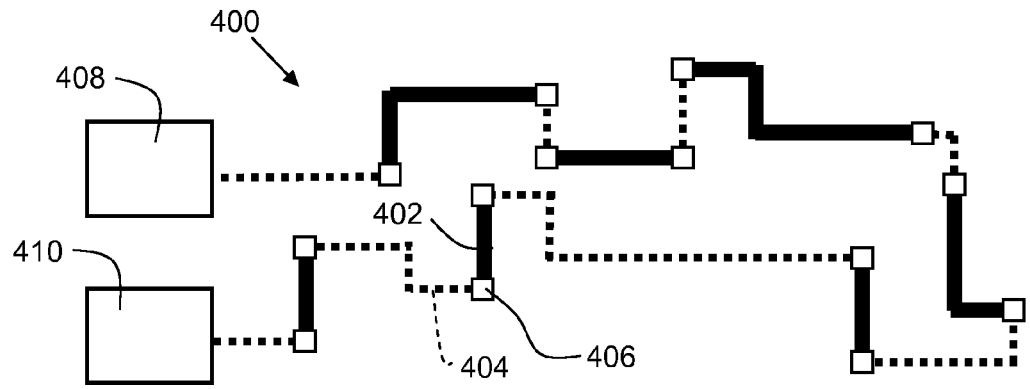
Figure 4:
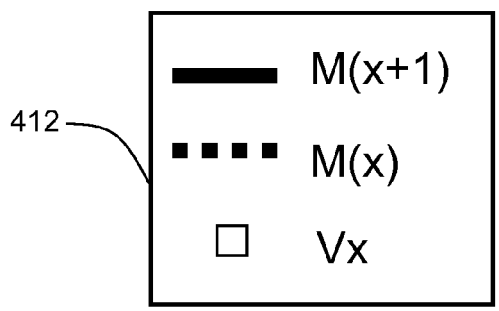

FIG. 4 shows a test circuit 400 for testing functional metal level M(x+1). M(x) and V(x) are test levels. A test mask is used for M(x) and V(x), and the positions of each via in the V(x) level is arranged as so to connect all two-ended shapes of functional mask M(x+1).

Certain portions of a metal mask that have more than two endpoints, such as an "E-shaped" segment (not shown), may be omitted from the scan chain. The test circuit 400 is evaluated in a similar manner to test circuit 300, which is by measuring the resistance between pads 408 and 410. As per legend 412, segment 402 (represented as a solid line) is a part of metal layer M(x+1) and segment 404 (represented as a dotted line) is a part of metal layer M(x). Each square represents a via in level V(x). The M(x) and V(x) layers are test layers, and M(x+1) is a functional layer.

Some of the advantages provided by embodiments of the present invention include the ability to detect process shifts in the fabrication process. Periodic testing (e.g. every 2500 exposures) can detect a possible problem with a photomask, such as possible damage or contamination. Another advantage is that this method inspects functional components, that is, parts of an actual level used in the integrated circuit, as opposed to relying solely on test patterns to perform analysis. Another advantage is the ability to isolate defects to within a particular layer, and sometimes within a particular area within the layer, depending on how many scan chains are used. Yet another advantage is reduction in "false positives." In many integrated circuit designs, redundant vias are used to increase reliability and product yield. If one of a group of redundant vias fails, embodiments of the present invention can still register a pass on the test, since the resistance between pads will still be low if at least one of the group of redundant vias is intact. For the test levels, various design constraints such as metal wiring widths and spacing can be increased, since the density is not as important in the test levels. This simplifies the design of the test levels for metal and vias and improves yield of the test levels ensuring maximum sensitivity for defects in the functional layer. For test metal levels, the width of the segments should exceed the minimum width of the feature size where possible, to ensure contact and electrical continuity. In one embodiment, the test metal segments are 10 to 20 percent wider than the minimum width (as indicated in FIG. 4, where M(x+1) is indicated with wider lines than M(x)). For example, if the minimum width of the segments is 45 nm (nanometers), then the test segments may have a width of 50-60 nanometers.

Figure 5:
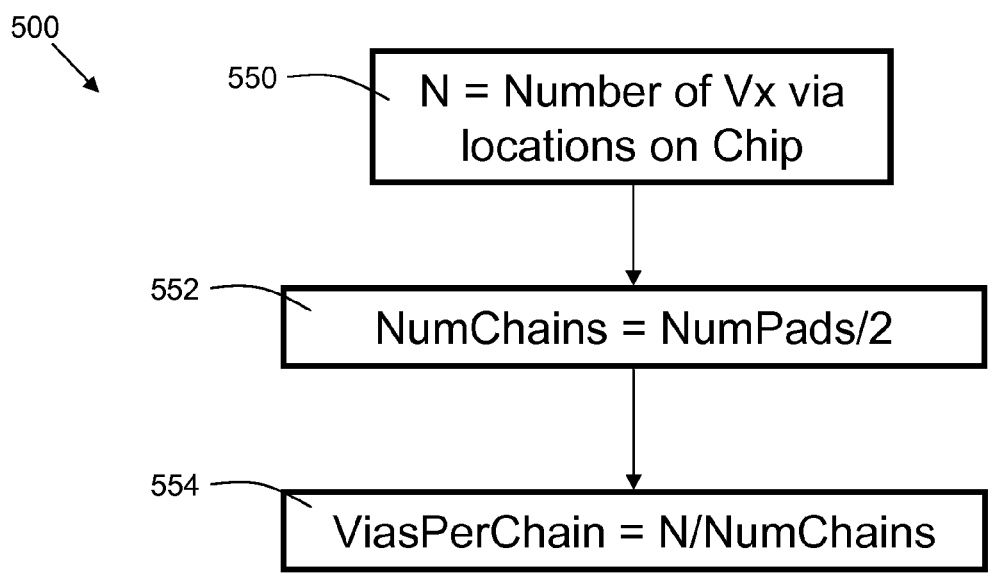

FIG. 5 shows a flowchart 500 for calculating parameters for conducting a via level test. In process step 550, the number of vias in via level V(x) is established as "N." In process step 552, the number of chains is computed as the number of pads divided by two. In process step 554, the number of vias per scan chain is computed as N divided by the number of chains. Note that the number of vias per scan chain computed in process step 554 is intended as a guideline. It is possible to practice embodiments of the present invention where different scan chains have different numbers of vias in them, such as in the case where various functional blocks are tested with different scan chains.

In one embodiment, the process for forming the scan chain to test a via level is as follows: Starting with a first pad (e.g. pad 308 of FIG. 3), build a metal segment to the nearest via at metal level M(x). Then build a metal segment from that via to another neighboring via using metal level M(x+1). This process repeats, alternating metal levels with each hop in between vias, until the complete scan chain is formed, terminating at the second pad (e.g. pad 310 of FIG. 3).

In an example, supposing there are 100 pad sets of 24 pads each within a particular chip design and also supposing that there are 7200 Vx vias, then the calculations outlined in flowchart 500 are computed as follows:
N=7200
NumPads=100×24=2400
NumChains=NumPads/2=2400/2=1200
ViasPerChain=N/NumChains=7200/1200=6

Note that the above example is merely illustrative, and the value of N used in the example is small compared to what would be encountered in a real application. In practice, the value N may be in excess of one million.

Figure 6:
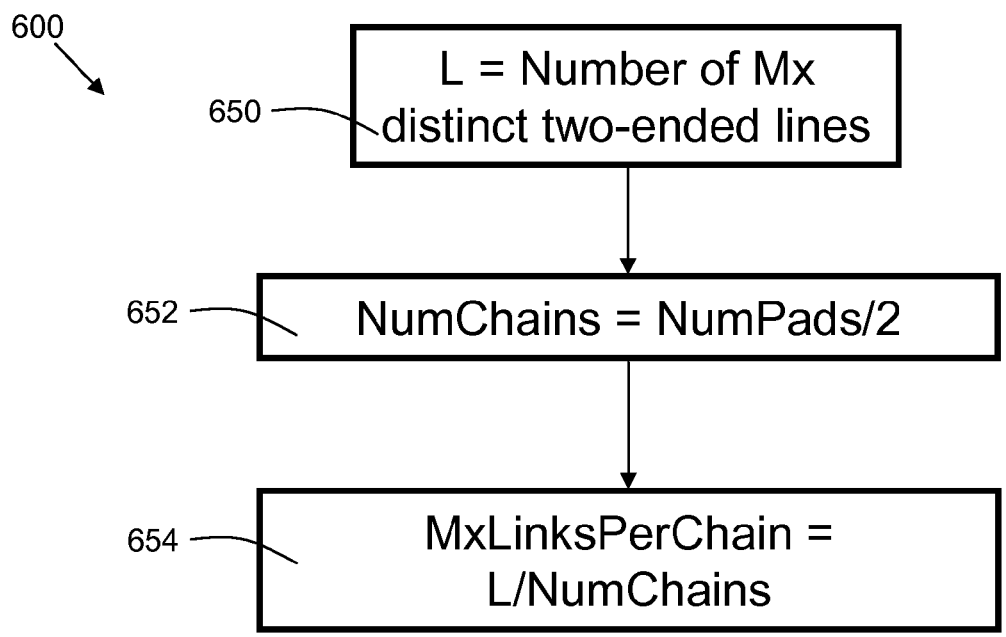

FIG. 6 shows a flowchart 600 for calculating parameters for conducting a metal level test. In process step 650, the number of distinct two-ended lines in functional metal level M(x) is established as "L." In process step 652, the number of chains is computed as the number of pads divided by two. In process step 654, the number of links per scan chain is computed as L divided by the number of chains. Note that the number of links per scan chain computed in process step 554 is intended as a guideline. It is possible to practice embodiments of the present invention where different scan chains have different numbers of links in them, such as in the case where various functional blocks are tested with different scan chains.

In one embodiment, the process for forming the scan chain to test a metal level M(x+1) is as follows: Starting with a first pad (e.g. pad 408 of FIG. 4), build a metal segment at level M(x) to the nearest end of the nearest segment at metal level M(x+1). Then build a via from metal level M(x+1) to metal level M(x) at that location. Traverse to the other end of the metal segment at metal level M(x+1) and build a via to level M(x), then form another metal segment at metal level M(x) to the nearest end of the next segment at metal level M(x+1). This process repeats, alternating metal levels with each hop in between vias, until the complete scan chain is formed, terminating at the second pad (e.g. pad 410 of FIG. 4).

As can now be appreciated, embodiments of the present invention provide the ability to conduct testing on functional areas of an integrated circuit to evaluate the current condition of production photomasks and reticles.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method for testing an integrated circuit, comprising the steps of:
    forming a plurality of scan chains, each scan chain formed by the steps of:
        forming a first endpoint;
        forming a second endpoint;
        forming a first metal layer, comprising a plurality of segments;
        forming a second metal layer, comprising a plurality of segments;
        forming a via layer, comprising a plurality of vias wherein each via is configured and disposed to connect a segment of the first metal layer to a segment of the second metal layer;
            wherein the step of forming the first metal layer comprises forming a segment connected to said first endpoint and also comprises forming a segment connected to said second endpoint; and
    wherein one of the layers formed is a functional layer, and wherein two of the layers formed are test layers;
        performing a resistance measurement between the first endpoint and second endpoint of each of the plurality of scan chains;
        indicating a failure if the resistance measurement exceeds a predetermined threshold; and
    wherein the step of forming a plurality of scan chains comprises the steps of:
    computing the number of scan chains as the number of endpoints divided by two; and
    computing the number of vias per scan chain as the total number of vias for a given level divided by the number of chains.

2. A method for testing an integrated circuit, comprising the steps of:
    forming a plurality of scan chains, each scan chain formed by the steps of:

forming a first endpoint;
forming a second endpoint;
forming a first metal layer, comprising a plurality of segments;
forming a second metal layer, comprising a plurality of segments;
forming a via layer, comprising a plurality of vias wherein each via is configured and disposed to connect a segment of the first metal layer to a segment of the second metal layer;
wherein the step of forming the first metal layer comprises forming a segment connected to said first endpoint and also comprises forming a segment connected to said second endpoint; and
wherein one of the layers formed is a functional layer, and wherein two of the layers formed are test layers;
performing a resistance measurement between the first endpoint and second endpoint of each of the plurality of scan chains;
indicating a failure if the resistance measurement exceeds a predetermined threshold; and
wherein the step of forming a plurality of scan chains comprises the steps of:
computing the number of scan chains as the number of endpoints divided by two; and
computing the number of segments per chain as the total number of two-ended segments for a given level divided by the number of chains.

3. The method of claim 1, wherein the step of forming a plurality of scan chains comprises associating each scan chain with a functional area of an integrated circuit.

4. The method of claim 1, wherein the step of forming a plurality of scan chains comprises assigning a plurality of functional elements to the test circuits based on physical positioning of each of the plurality of functional elements within the chip.

5. The method of claim 1, wherein the step of forming a via layer for each of the plurality of scan chains comprises forming a functional layer, and the step of forming the first metal layer and the step of comprising the second metal layer comprise forming test layers.

6. The method of claim 1, wherein the step of forming a second metal layer for each of the plurality of scan chains comprises forming a functional layer, and the step of forming a first metal layer and the step of forming a via layer comprise forming test layers.

7. The method of claim 1, wherein the step of forming a first endpoint and the step of forming a second endpoint for each of the plurality of scan chains comprise forming a metal pad.

8. The method of claim 2, wherein the step of forming a plurality of scan chains comprises associating each scan chain with a functional area of an integrated circuit.

9. The method of claim 2, wherein the step of forming a plurality of scan chains comprises assigning a plurality of functional elements to the test circuits based on physical positioning of each of the plurality of functional elements within the chip.

10. The method of claim 2, wherein the step of forming a via layer for each of the plurality of scan chains comprises forming a functional layer, and the step of forming the first metal layer and the step of comprising the second metal layer comprise forming test layers.

11. The method of claim 2, wherein the step of forming a second metal layer for each of the plurality of scan chains comprises forming a functional layer, and the step of forming a first metal layer and the step of forming a via layer comprise forming test layers.

12. The method of claim 2, wherein the step of forming a first endpoint and the step of forming a second endpoint for each of the plurality of scan chains comprise forming a metal pad.

* * * * *